(12) United States Patent
Kamikawa

(10) Patent No.: US 8,201,567 B2
(45) Date of Patent: Jun. 19, 2012

(54) LIQUID TREATING APPARATUS

(75) Inventor: Yuji Kamikawa, Tosu (JP)

(73) Assignee: Tokyo Electron Limited, Tokyo (JP)

( * ) Notice: Subject to any disclaimer, the term of this patent is extended or adjusted under 35 U.S.C. 154(b) by 809 days.

(21) Appl. No.: 11/665,847

(22) PCT Filed: Oct. 27, 2005

(86) PCT No.: PCT/JP2005/019815
§ 371 (c)(1),
(2), (4) Date: Feb. 2, 2009

(87) PCT Pub. No.: WO2006/046657
PCT Pub. Date: May 4, 2006

(65) Prior Publication Data
US 2009/0151756 A1    Jun. 18, 2009

(30) Foreign Application Priority Data

Oct. 28, 2004    (JP) .................................. 2004-313550

(51) Int. Cl.
*B08B 3/04*    (2006.01)
(52) U.S. Cl. ......... 134/95.1; 134/84; 134/94.1; 134/200
(58) Field of Classification Search .................. 134/84, 134/94.1, 95.1, 95.2, 200, 902
See application file for complete search history.

(56) References Cited

U.S. PATENT DOCUMENTS

| | | | | |
|---|---|---|---|---|
| 4,885,947 A | * | 12/1989 | Balter et al. .................. 74/18.1 |
| 5,906,860 A | * | 5/1999 | Motoda et al. ................ 427/240 |
| 6,115,867 A | * | 9/2000 | Nakashima et al. ............... 15/77 |
| 6,276,378 B1 | * | 8/2001 | Taniyama et al. ............. 134/153 |
| 6,357,457 B1 | * | 3/2002 | Taniyama et al. ........... 134/57 R |
| 6,374,836 B1 | * | 4/2002 | Oroku ........................... 134/153 |
| 6,722,964 B2 | * | 4/2004 | Kimura et al. ................ 451/285 |
| 7,048,824 B1 | | 5/2006 | Werfel et al. |
| 2002/0000240 A1 | | 1/2002 | Kamikawa |
| 2003/0194878 A1 | * | 10/2003 | Miya ............................. 438/745 |

FOREIGN PATENT DOCUMENTS

| | | |
|---|---|---|
| JP | 09-162152 | 6/1997 |
| JP | 10-135172 | 5/1998 |
| JP | 2002-016041 | 1/2002 |
| JP | 2002-100605 | 4/2002 |
| JP | 2004-507068 | 3/2004 |

OTHER PUBLICATIONS

PCT Notification of Transmittal of Translation of the International Preliminary Examination Report (Form PCT/IB/338) dated Jan. 2004.
PCT International Preliminary Report on Patentability (Form PCT/IPEA/409) dated Apr. 2005.

* cited by examiner

*Primary Examiner* — Michael Barr
*Assistant Examiner* — Benjamin Osterhout
(74) *Attorney, Agent, or Firm* — Smith Gambrell & Russell, LLP

(57) ABSTRACT

A liquid treating apparatus comprising a holding device (30) for holding wafers (W) in a substantially vertical attitude and a treating vessel (10) for accommodating the wafers held by the holding device. A treating liquid is supplied into the treating vessel by means of a treating liquid supply system. A rotational drive device (20) is provided for rotating the holding device (30) around a rotational axis passing approximately through the center of the wafers (W) in a state of non-contact with the treating vessel (10).

14 Claims, 10 Drawing Sheets

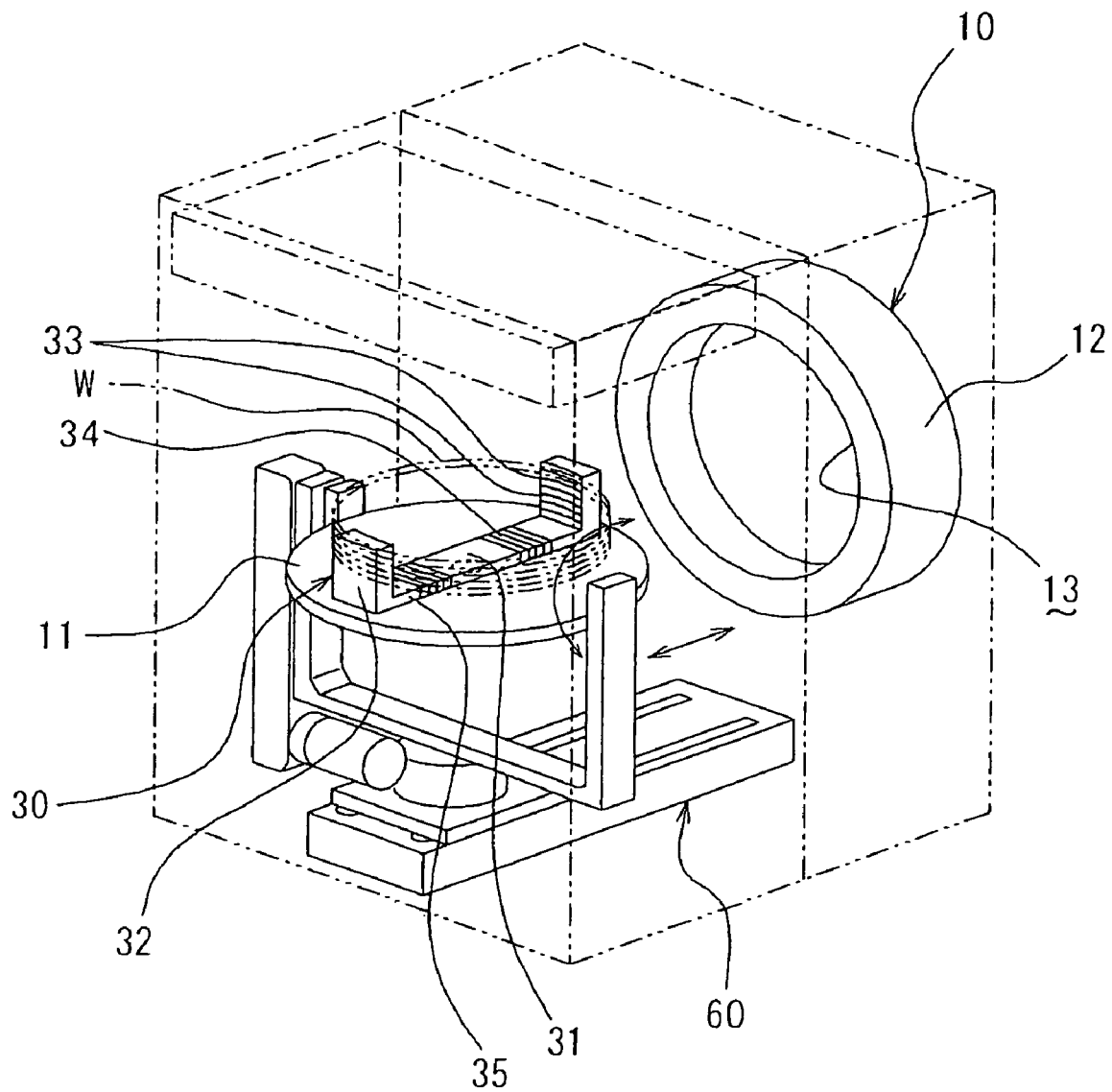
F I G. 3

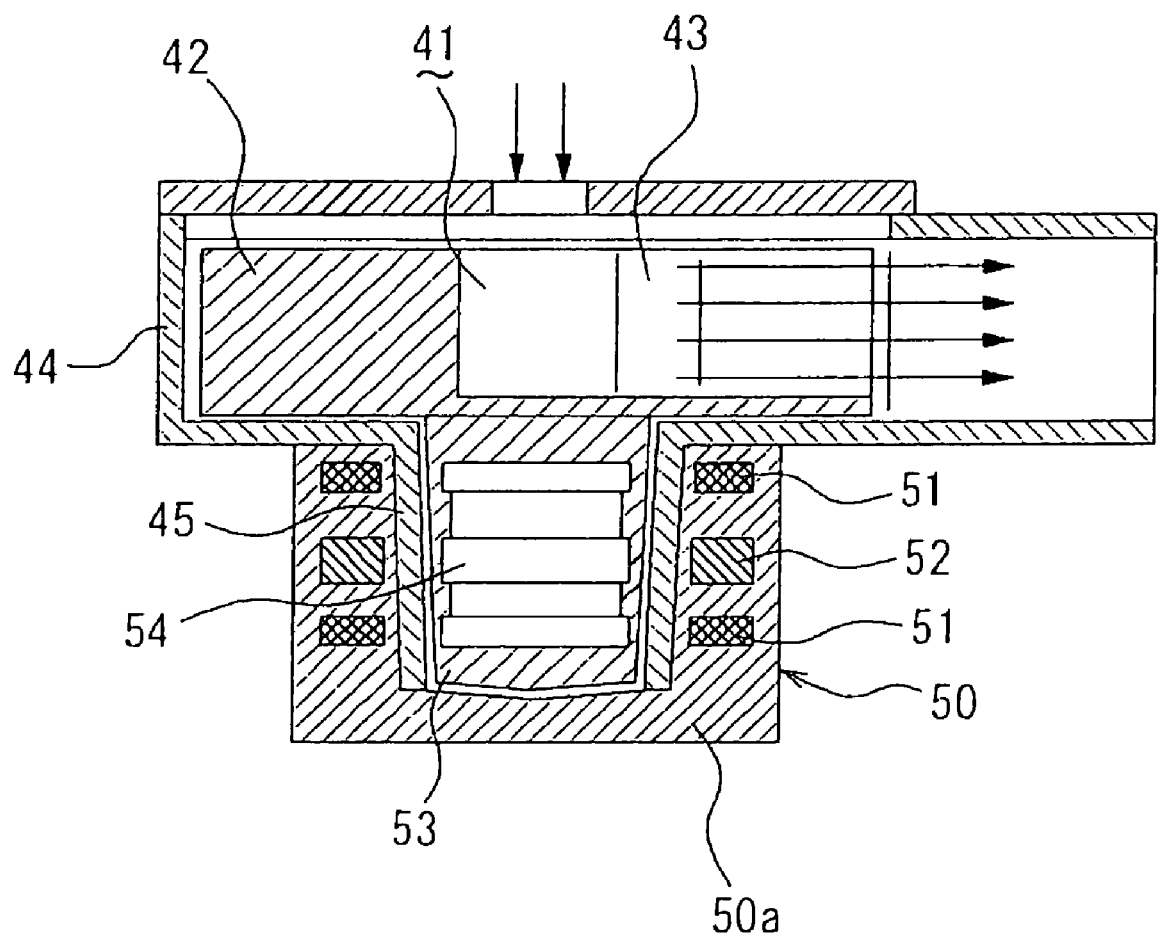
F I G. 7 ptimg # LIQUID TREATING APPARATUS

TECHNICAL FIELD

The present invention relates to a liquid treating apparatus for supplying treating liquid to a workpiece such as, for example, a semiconductor wafer, a glass substrate or a disk substrate and treating, for example cleaning or etching, the workpiece.

BACKGROUND ART

In general, a manufacturing process in semiconductor device manufacturing equipment involves a liquid treating method, which is widely used, wherein a workpiece such as a semiconductor wafer or a glass substrate for LCD is immersed in a treating vessel in which treating liquid such as liquid chemical or rinsing liquid is stored and the treating liquid is supplied to perform a treatment.

As a liquid treating apparatus for practicing such a liquid treating method there is known an apparatus wherein a workpiece is rotated by rotating means within treating liquid stored in a treating vessel and treating liquid, e.g., liquid chemical and rinsing liquid (pure water) are supplied successively from a treating liquid supply section to perform a treatment. In this liquid treating apparatus, the rotating means is constituted by two rollers which support the peripheral portion of the workpiece. The rollers are formed so as to receive a rotational driving force in a non-contact manner from a roller drive section and be rotatable in a non-contact manner with respect to the treating vessel (see, for example, JP-A-2002-100605).

DISCLOSURE OF THE INVENTION

However, particles may occur in the technique disclosed in JP-A-2002-100605, because the rollers are brought into contact with the peripheral portion of the workpiece, thereby causing rotation of the workpiece. Consequently, the problem arises that the generated particles adhere to the workpiece. Also stagnation of the treating liquid may occur between a rotary shaft and bearings in the roller drive section. Thus, there also exists the problem that the treating liquid is not supplied smoothly due to the stagnation of the treating liquid, resulting in uniformity of the treatment being impaired.

The present invention has been accomplished in view of the above-mentioned circumstances and it is an object of the invention to provide a liquid treating apparatus capable of making contact between a workpiece and treating liquid uniform, thereby improving the uniformity of liquid treatment, while preventing the generation of particles.

According to the present invention, for achieving the above-mentioned object, there is provided a liquid treating apparatus comprising:

holding means for holding a generally flat plate-like workpiece in a substantially vertical attitude;

a treating vessel for accommodating the workpiece held by the holding means;

a treating liquid supply system for supplying a treating liquid to the workpiece accommodated in the treating vessel; and rotational drive means for rotating the holding means around a rotational axis passing approximately through the center of the workpiece in a state of non-contact with the treating vessel.

According to this liquid treating apparatus it is possible to suppress the generation of particles caused by rotation of the holding means. Consequently, the contact between the workpiece and the treating liquid can be made uniform in a state of a reduced amount of particles and the whole surface of the workpiece can be treated with the treating liquid uniformly.

Preferably, in this liquid treating apparatus, the holding means includes a driven shaft adapted to be rotationally driven by the rotational drive means, and the treating vessel includes an enclosure member which encloses the driven shaft of the holding means so as to form a gap between it and the driven shaft, the enclosure member having a liquid supply port for supplying the treating liquid into the gap.

With the treating liquid supply system, the treating liquid is supplied not only to the workpiece accommodated in the treating vessel but also into the gap from the liquid supply port, whereby it is possible to prevent stagnation of the treating liquid within the gap. Consequently, not only the deterioration of uniformity in the liquid treatment caused by stagnation of the treating liquid can be prevented, but also the treatment efficiency can be improved by promoting replacement of the treating liquid.

Preferably, the liquid supply port is positioned on the rotational axis, whereby it becomes easier for the treating liquid to flow uniformly around the driven shaft.

In this case, from the standpoint of smoothing the flow of the treating liquid so that the treating liquid can flow more uniformly, it is preferable that the driven shaft have a convex end opposed to the liquid supply port.

To ensure drying within the gap, it is preferable for the liquid treating apparatus to further comprise a gas supply system for supplying a drying gas into the gap through the liquid supply port.

In this case, it is preferable that the treating vessel includes a gas supply port through which the drying gas is supplied to the workpiece by the gas supply system.

Consequently, the workpiece thus treated with the treating liquid is dried with the drying gas as supplied from the gas supply port and at the same time it is possible to dry the interior of the gap.

Preferably, the treating liquid supply system is configured so that it can supply at least first and second treating liquids, and in the liquid treating apparatus, when the first treating liquid is supplied by the treating liquid supply system, the first treating liquid is supplied from the liquid supply port into the gap, while when the second treating liquid is supplied by the treating liquid supply system, the second treating liquid is supplied from the liquid supply port into the gap.

According to this configuration, when treatment with the first treating liquid and treatment with the second treating liquid are performed successively, it is possible to effect replacement from one treating liquid to the other quickly within the treating vessel so that the former treating liquid does not remain within the same vessel. Consequently, it is possible to improve the efficiency when performing such treatments in order.

From the standpoint of holding the workpiece easily and reliably it is preferable for the holding means to include at least a pair of holding members for holding an outer edge of the workpiece from outside in a radial direction with respect to the rotational axis and a moving mechanism for moving the holding members radially with respect to the rotational axis.

In this case, it is preferable for the holding means to further include a driven shaft adapted to be rotationally driven by the rotational drive means, an operating shaft disposed concentrically within the driven shaft and actuator means for rotating the operating shaft relatively with respect to the driven shaft, and the moving mechanism is operated by the relative rotation of the operating shaft.

By thus incorporating elements for operating the moving mechanism into the driven shaft it is possible to reduce the size of the liquid treating apparatus.

It is preferable for the treating vessel to include a vessel body, the vessel body having an enclosure wall and a closing wall, the enclosure wall enclosing the workpiece from outside in a radial direction with respect to the rotational axis and having openings on both end sides thereof in the rotational axis direction, and the closing wall closing one-end side of the enclosure wall, and a lid for opening and closing the other end-side opening of the enclosure wall in a fluid-tight manner.

According to this configuration, the treating vessel becomes a fluid-tight sealed vessel which is not likely to be badly influenced by the exterior atmosphere such as, for example, oxygen contained in air, an air current or temperature, during treatment. Consequently, it is possible to improve the treatment quality.

In this case, the holding means may be attached to the lid or may be attached to the vessel body.

Preferably, the holding means includes a driven shaft adapted to be rotationally driven by the rotational drive means, the treating vessel includes an enclosure member which encloses the driven shaft of the holding means, the rotational drive means is configured to hold the driven shaft in a state free of contact with the enclosure member under the action of an electromagnetic force, and the liquid treating apparatus further comprises movement inhibiting means for inhibiting a downward movement of the driven shaft of the holding means with respect to the enclosure member in a state in which the electromagnetic force does not act.

By thus utilizing the electromagnetic force the holder means can be made rotatable easily in a state of non-contact with the treating vessel. Even in a state in which the electromagnetic force does not act due to for example a power failure, a downward movement of the driven shaft can be prevented by the movement inhibiting means. As a result, it is possible to prevent the holding means and the treating vessel from being damaged by a shock or the like exerted thereon and hence possible to improve the reliability of the apparatus.

BRIEF DESCRIPTION OF THE DRAWINGS

FIG. 3 is a perspective view showing a principal portion of the treatment system shown in FIG. 1.

FIG. 7 is a vertical sectional view showing a treating liquid nozzle and the vicinity thereof in the liquid treating apparatus shown in FIG. 5.

BEST MODE FOR CARRYING OUT THE INVENTION

Embodiments of the present invention will be described in detail hereinunder with reference to the accompanying drawings.

<First Embodiment>

First, a description will be given about a liquid treating apparatus according to a first embodiment of the present invention and a treatment system provided with the liquid treating apparatus.

Figure 1:
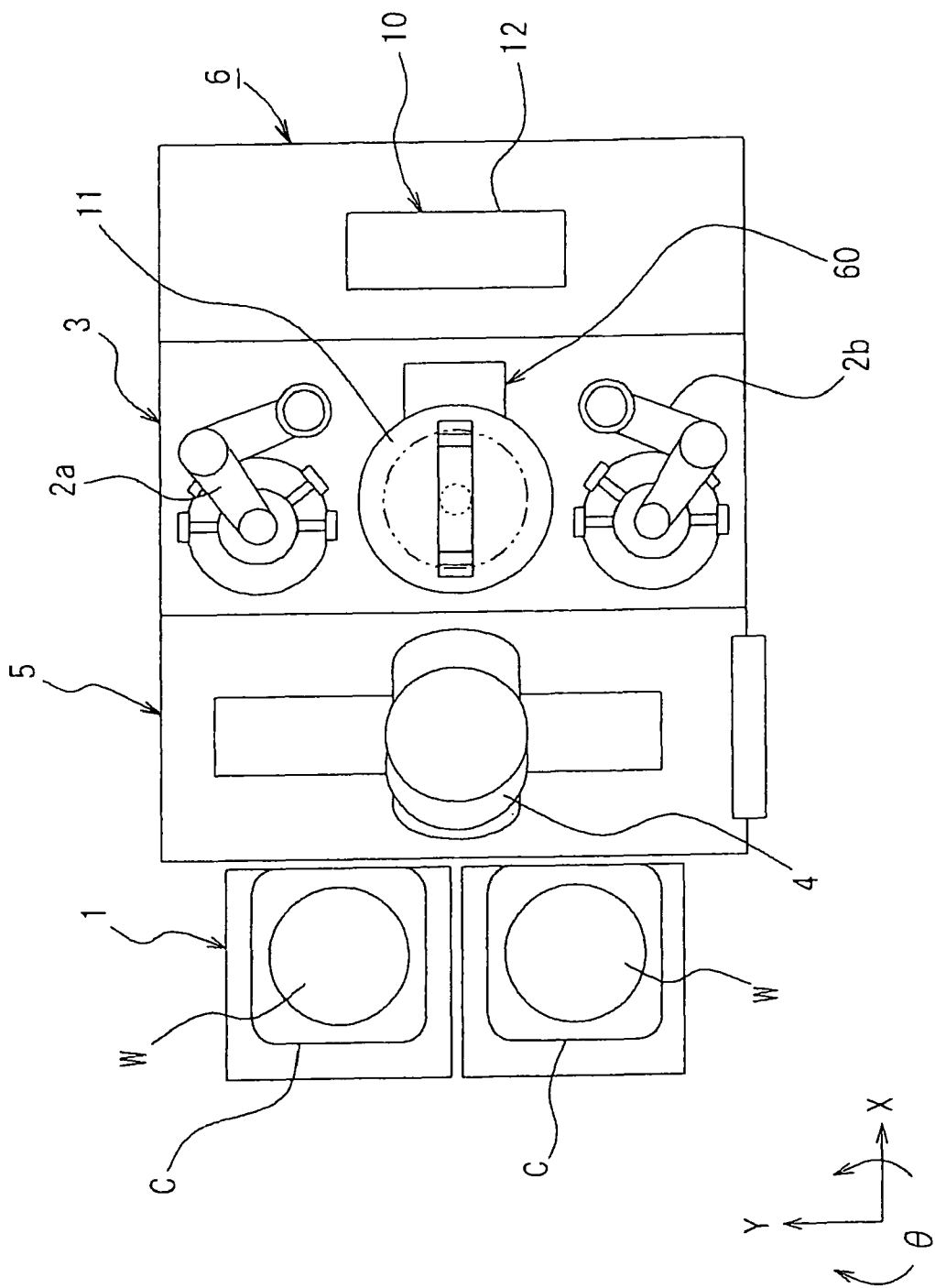
FIG. 1 is a schematic plan view showing an example of a treatment system provided with a liquid treating apparatus according to the present invention.
Figure 2:
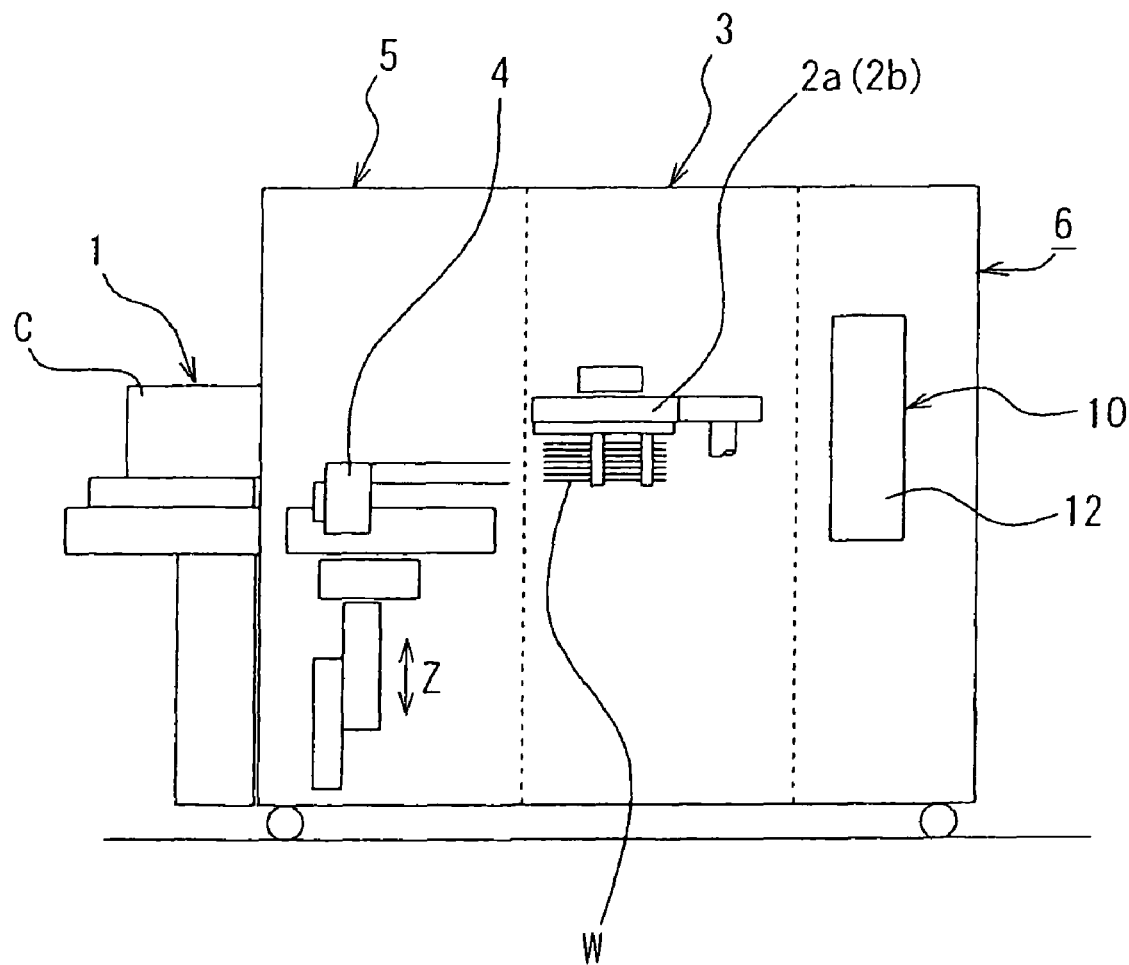
FIG. 2 is a schematic vertical sectional view of the treatment system shown in FIG. 1.

As shown in FIGS. 1 and 2, the treatment system includes a loading/unloading section 1 for carriers C each holding plural semiconductor wafers W as generally flat plate-like workpieces, a pitch changing/conveying section 3, a wafer conveying section 5, and a liquid treating apparatus 6.

Each carrier C holds for example twenty-five wafers W horizontally at predetermined spacings, for example, at spacings of 10 mm. In the pitch changing/conveying section 3 there are disposed two wafer holders 2a and 2b which hold the wafers W at predetermined spacings, for example, at spacings of 3 mm, and which have a pitch changing function. The wafer conveying section 5 is provided between the loading/unloading section 1 and the pitch changing/conveying section 3. In the wafer conveying section 5 there is provided a conveyance arm 4 for the transfer of wafers W between the carriers C and the wafer holders 2a, 2b, the conveyance arm 4 being movable in X and Y directions orthogonal to each other within a horizontal plane and also in vertical Z direction and rotatable (in θ direction) within the horizontal plane.

The liquid treating apparatus 6 includes a vessel body 12 which forms a sealed treating vessel 10 together with a lid 11 (in FIGS. 1 and 3 the lid 11 is placed in a horizontal attitude in the pitch changing/conveying section 3). The lid 11 disposed in the pitch changing/conveying section 3 is positioned between the two wafer holders 2a and 2b which confront each other in Y direction. As shown in FIG. 3, by means of an attitude changing/moving mechanism 60 the lid 11 is moved so as to be united with the vessel body 12 while its attitude is changed from horizontal to a substantially vertical attitude. To the lid 11 is attached a holding device 30 which holds the wafers W in a substantailly vertical attitude when the lid is united with the vessel body 12 (during treatment).

In other words, the liquid treating apparatus 6 includes the holding device 30 for holding the wafers W in a substantially vertical attitude and the treating vessel 10 for accommodating the wafers W held by the holding device 30. The liquid treating apparatus 6 further includes a treating liquid supply system 40 (FIG. 4) for the supply of treating liquid to the wafers W accommodated in the treating vessel 10 and a rotational drive device 20 (FIG. 6) for rotating the holding device 30 in a state of non-contact with the treating vessel 10. As will be described later, the rotational drive device 20 causes the holding device 30 to rotate around a rotational axis passing approximately through the center of the wafers W in a state of non-contact with the treating vessel 10.

Figure 5:
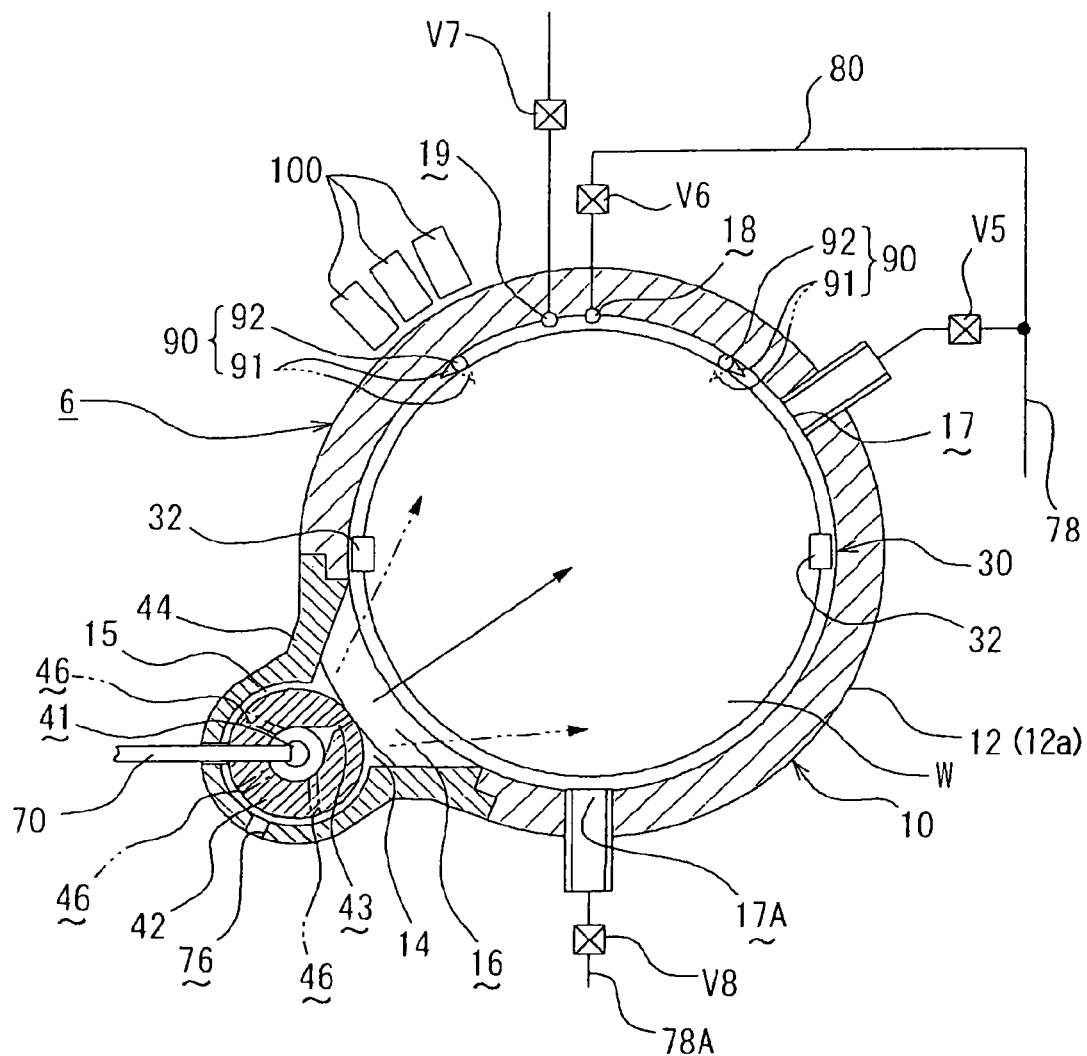
FIG. 5 is a cross sectional view showing a liquid treating apparatus according to a first embodiment of the present invention.
Figure 6:
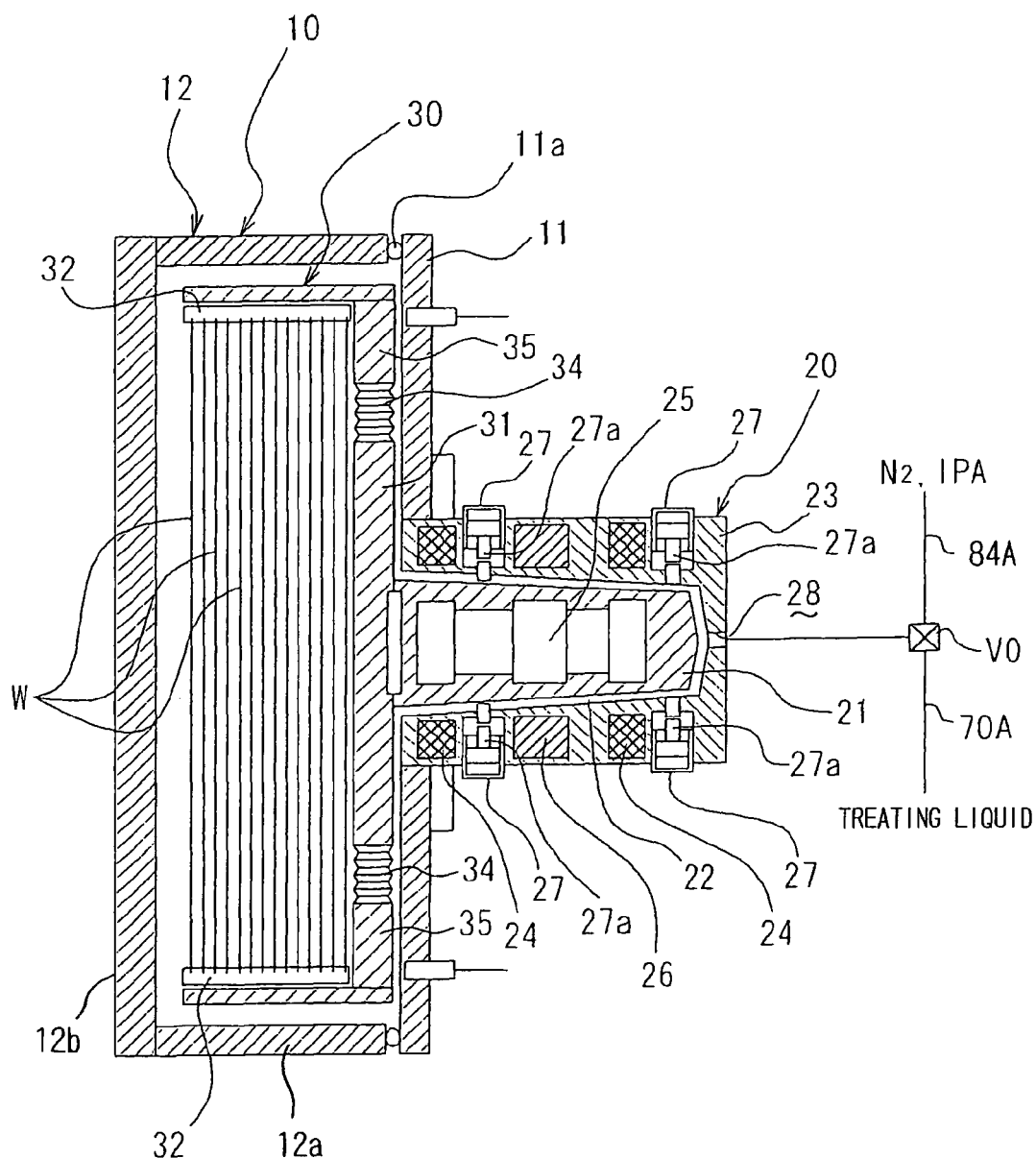
FIG. 6 is a vertical sectional view of the liquid treating apparatus shown in FIG. 5.

As shown in FIG. 6, the vessel body 12 includes a cylindrical enclosure wall 12a having openings on both axial end sides thereof and a closing wall 12b for closing one end-side opening of the enclosure wall 12a. As shown in FIG. 5, a receptacle portion 14, which is in communication with the interior of the vessel 10 through a communication port 16, is connected to a lower part of the enclosure wall 12a of the vessel body 12. A drain port 17 is formed in the enclosure wall 12a at a position opposed to the receptacle portion 14. In a bottom of the enclosure wall 12a is formed a quick drain port 17A, while in an upper portion of the enclosure wall 12a there are formed an air vent 18 and a gas supply port 19.

As shown in FIGS. 3 and 6, the lid 11 is formed in a shape of a disc so as to close an opposite end-side opening 13 of the vessel body 12 when the lid is united with the vessel body. An O-ring 11a (FIG. 6) is fitted on the surface of the lid 11 opposed to the opening 13, whereby the lid 11 can close the opening 13 of the vessel body 12 in a liquid-tight manner and open it.

Figure 8:
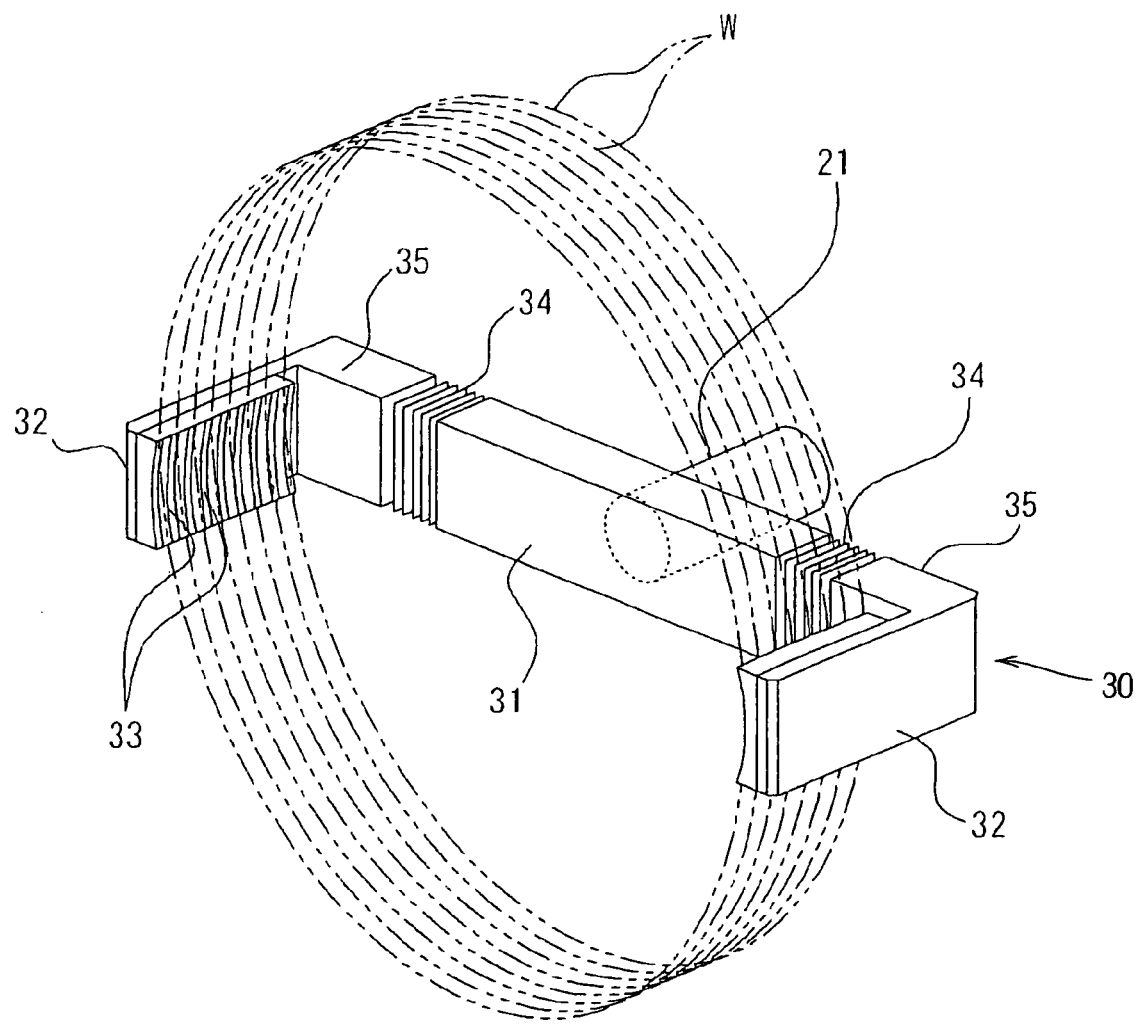
FIG. 8 is a perspective view showing a holding device in the liquid treating apparatus shown in FIG. 5.

As shown in FIGS. 6 and 8, the holding device 30 includes a driven shaft 21 disposed on a rotational axis and extending through the center of the lid 11 (FIG. 6). To the lid 11 is attached an enclosure member 23 which encloses the driven shaft 21 so as to form a gap 22 between the enclosure member 23 and the driven shaft 21 (FIG. 6). The holding device 30 includes a pair of holding members 32 for holding outer edges of the wafers W from outside in the radial direction with respect to the rotational axis. The holding device 30 further includes a beam-like base member 31 joined to the driven shaft 21 and extending in the diametrical direction with respect to the rotational axis. Movable members 35 are attached respectively through bellows-like expansion members 34 to both ends of the base member 31 in a radially movable manner. The holding members 32 are integrally joined to the movable members 35 respectively. In an inner surface of each holding member 32 there are formed plural holding grooves 33 spacedly from one another so as to receive the outer edges of the wafers W therein. In the interior of the base member 31 there is provided a moving mechanism (not shown) for moving the pair of holding members 32 in the radial direction with respect to the rotational axis through the movable members 35.

According to the holding device 30 thus constructed, the wafer holder 2a or 2b (FIGS. 1 and 2) which holds the wafers W is received between the pair of holding members 32 in a state in which the holding members 32 have been moved radially outwards by the moving mechanism, thereafter, the pair of holding members 32 is moved radially inwards by the moving mechanism, whereby it is possible to receive the wafers W from the wafer holder and hold them. The wafers W held on the lid 11 by the holding device 30 are changed their attitude into a substantially vertical attitude by the attitude changing/moving mechanism 60 and can be accommodated within the vessel body 12. Further, in accordance with the reverse procedure, the wafers W after treatment are taken out from the vessel body 12 and are changed their attitude into a horizontal attitude, thereafter, the wafer holder can be received between the pair of holding members 32. Subsequently, the pair of holding members 32 are moved radially outwards by the moving mechanism, whereby the wafer W can be delivered to the wafer holder.

The rotational drive device 20 includes ring-like electromagnets for floating which are embedded in the enclosure member 23 spacedly in the axial direction. On the other hand, a permanent magnet 25 is embedded in the driven shaft 21. The enclosure member 23 and the driven shaft 21 are both formed of a material having high resistance to chemicals and to corrosion, e.g., a synthetic resin such as polytetrafluoroethylene (PTFE).

In the rotational drive device 20 thus constructed, the driven shaft 21 can be rotated in a non-contact state with the gap 22 present between the driven shaft 21 and the enclosure member 23 by causing an appropriate electric current to flow to the electromagnets 24 for floating. Thus, the holding device 30 can be rotated around the rotational axis passing approximately through the center of the wafers W in a state of non-contact with the treating vessel 10. Consequently, it is possible to suppress the generation of particles caused by rotation of the holding device 30. A positioning electromagnet 26 is embedded between the floating electromagnets 24 in the enclosure member 23. By the supply of electric power to the positioning electromagnet 26, the driven shaft 21 can be positioined in the axial direction of the driven shaft 21. In accordance with a control signal provided from a controller (not shown) the rotational drive device 20 controls both current and voltage to be supplied to the electromagnets 24, whereby the rotational direction and the number of revolutions (e.g., 1 to 60 rpm) of the driven shaft 21 can be controlled.

Grip cylinders 27 are attached to the enclosure member 23 axially spacedly, the grip cylinders 27 being movement inhibiting devices for inhibiting a downward movement of the driven shaft 21 in a state in which no electromagnetic force acts on the floating electromagnets 24. The grip cylinders 27 have respective piston rods 27a adapted to extend and support the driven shaft 21 when the supply of electric power to the floating electromagnets 24 is stopped and cut off by a power failure or the like.

A liquid supply port 28 for the supply of treating liquid (liquid chemical or pure water) into the gap 22 is formed on a front end side of the enclosure member 23. whereby it is possible to prevent stagnation of the treating liquid within the gap 22 during treatment of the wafers W with the treating liquid. The liquid supply port 28 is disposed on the rotational axis and the driven shaft 21 has a convex-shaped front end portion opposed to the liquid supply port 28. Consequently, it is possible to smooth the flow of treating liquid supplied from the liquid supply port 28 and make the treating liquid easy to flow uniformly around the driven shaft 21. Not only a treating liquid supply pipe 70A for the supply of treating liquid such as liquid chemical and rinsing liquid (pure water) but also a drying gas supply pipe 84 for the supply of drying gas such as nitrogen gas ($N_2$) is connected to the liquid supply port 28.

Figure 4:
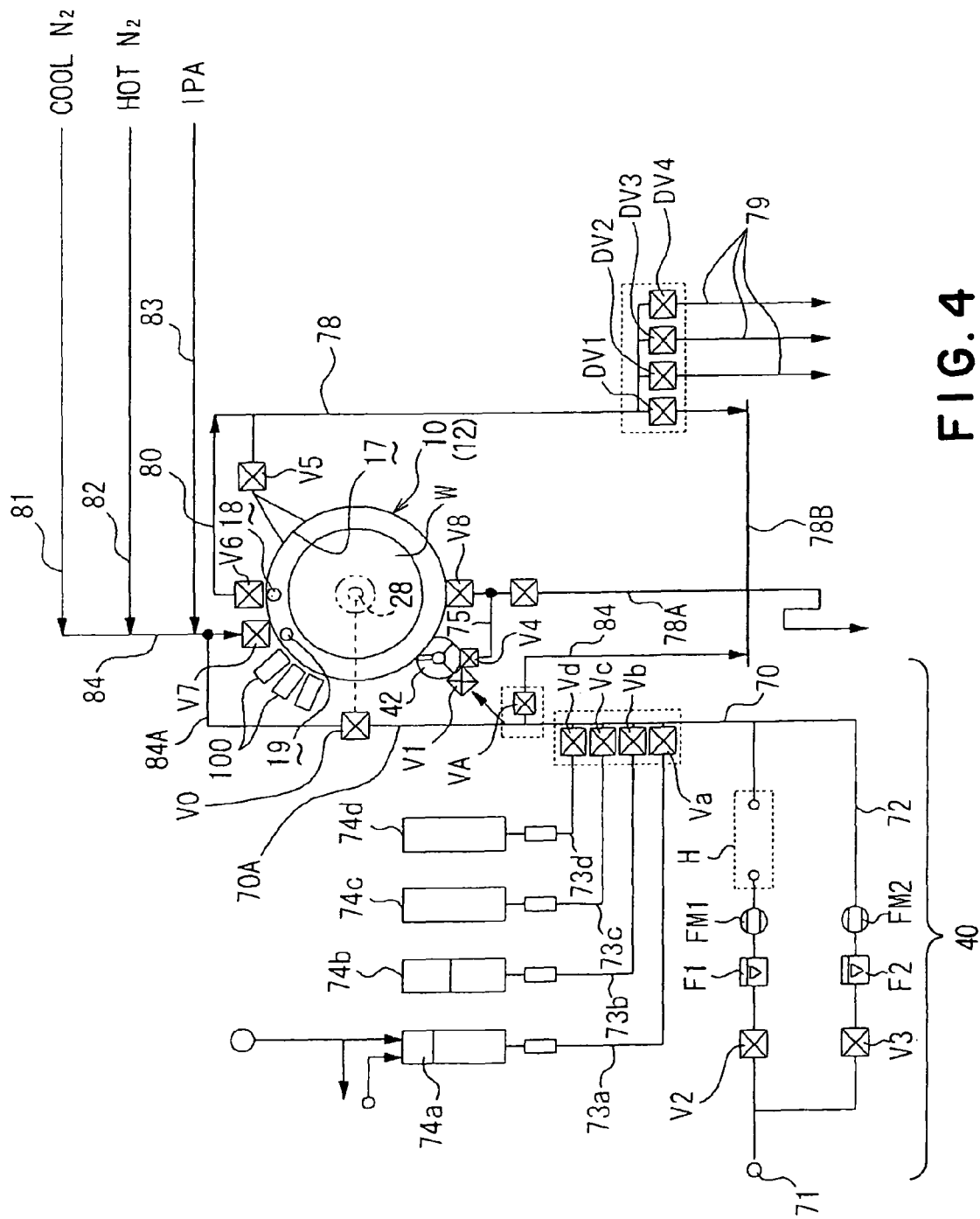
FIG. 4 is a schematic diagram showing a piping system of the liquid treating apparatus according to the present invention.

As shown in FIGS. 5 and 7, the treating liquid supply system 40 shown in FIG. 4 includes a generally cylindrical supply member 42 accommodated within the receptacle portion 14 of the treating vessel body 12. The supply member 42 includes a central supply path 41 and a nozzle 43 communicating with the supply path 41. The nozzle 43 is formed as a plurality of axial slits or axially spaced holes. An axially extending nozzle rotating shaft 53 is attached to one end face of the supply member 42. The rotating shaft 53 is inserted through a gap into a guide cylinder 45 integral with a case 44 which constitutes the receptacle portion 14. A nozzle rotating device 50 for rotating the nozzle rotating shaft 53 is mounted around the guide cylinder 45. By operation of the rotating device 50 the supply member 42 can be rotated in a state of non-contact with the treating vessel 10 (case 44). On the back side of the nozzle 43 in the supply member 42 there may be formed at least one a liquid stagnation preventing hole 46 (FIG. 5). By causing the treating liquid to flow through the hole 46 into a gap 15 formed between the supply member 42 and the case 44, coupled with rotation of the supply member 42, it is possible to prevent stagnation of the treating liquid within the gap 15 and hence possible to let new liquid chemical be supplied constantly.

As shown in FIG. 7, the nozzle rotating device 50 includes a bottomed enclosure member 50a fitted on an outer periphery surface of the guide cylinder 45. An electromagnet 51 for floating and an electromagnet 52 for positioning are embedded in the enclosure member 50a. On the other hand, a magnet 54 is embedded in the nozzle rotating shaft 53. According to the nozzle rotating device 50, by energizing the floating electromagnet 51 and the positioning electromagnet 52, the nozzle rotating shaft 53 can be rotated in a non-contact state with a gap present between the guide cylinder 45 and the enclosure member 50a. Therefore, it is possible to suppress the generation of particles caused by rotation of the supply member 42 and rotation of the nozzle rotating shaft 53. The nozzle enclosure member 50a and the nozzle rotating shaft 53 are both formed of a material having high resistance to chemicals and to corrosion, e.g., a synthetic resin such as PTFE. Further, as to the nozzle rotating device 50, the rotation of the nozzle rotating device 50 can be controlled in accordance with a control signal provided from a controller (not shown).

Next, with reference mainly to FIG. 4, a description will be given about the treating liquid supply system 40 including the supply member 42. One end of a main supply pipe 70 is connected through a first opening/closing valve VI to the treating liquid supply path 41 (FIG. 5) of the supply member 42. A pure water supply source 71 is connected to an opposite end of the main supply pipe 70. A branch pipe 72 is connected in parallel with the main supply pipe 70 on the side of the pure water supply source 71. A second opening/closing valve V2, a filter F1, a flow meter FM1 and a heating mechanism H for adjusting the temperature of the treating liquid to a predetermined treatment temperature are disposed in the portion of the main supply pipe 70 parallel with the branch pipe 72 in this order from the pure water supply source side. Likewise, a third opening/closing valve V3, a filter F2 and a flow meter FM2 are disposed in the branch pipe 72 in this order from the pure water supply source side.

Further, liquid chemical supply pipes 73a, 73b, 73c and 73d communicating with liquid chemical tanks 74a, 74b, 74c and 74d respectively are connected to an intermediate portion of the main supply pipe 70 through change-over supply valves Va, Vb, Vc and Vd. Liquid chemicals of different kinds, e.g., ammonium hydroxide ($NH_4OH$), hydrochloric acid (HCl), hydrofluoric acid (HF), are stored in the liquid chemical tanks 74a, 74b, 74c and 74d respectively. By opening any of the change-over supply valves Va, Vb, Vc and Vd according to the purpose of treatment, the liquid chemical stored in the selected tank is mixed with pure water flowing in the main supply pipe 70 and the resulting mixture can be supplied from the supply member 42 to the wafers W in the treating vessel 10. The supply pipe 70A branched from the main supply pipe 70 on the side of the supply member 42 is connected to the liquid supply port 28 through a change-over valve V0 (see FIG. 6), whereby the same treating liquid (liquid chemical, pure water) as that supplied from the supply member 42 to the wafers W can be supplied into the gap 22 (see FIG. 6) from the liquid supply port 28.

A discharge pipe 75 with an opening/closing valve V4 interposed therein is connected to a drain port 76 (FIG. 5) formed in the case 44 of the receptacle portion 14. The discharge pipe 75 is connected to a drain pipe 78A.

A drain pipe 78 with an opening/closing valve V5 interposed therein is connected to the drain port 17 of the vessel body 12 (see FIG. 5). A downstream side of the drain pipe 78 is connected to a drain pipe 78B through a drain valve DV1 for pure water and, before the valve DV1, is branched to three drain pipes 79 having drain valves DV2, DV3 and DV4 for liquid chemicals.

An exhaust pipe 80 with an opening/closing valve V6 interposed therein is connected to the air vent 18 (see FIG. 5) of the vessel body 12, the degree of opening of the opening/closing valve V6 being adjustable. Stagnation of bubbles within the treating vessel 10 is prevented by opening the valve V6. The exhaust pipe 80 is connected to the drain pipe 78.

A cool nitrogen gas ($N_2$) supply pipe 81, a hot nitrogen gas ($N_2$) supply pipe 82 and an isopropyl alcohol (IPA) supply pipe 83 are connected to the gas supply port 19 (see FIG. 5) of the vessel body 12 through an opening/closing valve V7 and a supply pipe 84. The treating liquid supply system is configured so that cool or hot nitrogen gas ($N_2$) and IPA vapor are supplied, when required, to the wafers W in the treating vessel 10 from a nitrogen gas ($N_2$) supply source and an IPA supply source (neither shown) through the pipes 81-84. A branch pipe 84A from the supply pipe 84 is connected through the change-over valve V0 to the supply port 28 of the rotational drive device 20 (see FIG. 6), whereby drying gas is supplied into the gap 22 (see FIG. 6) during drying treatment for the wafers W, thereby making it possible to remove droplets remaining within the gap 22 and promote drying.

The drain pipe 78A is connected to the quick drain port 17A (see FIG. 5.) of the vessel body 12 through an opening/closing valve V8. As the drain pipe 78A, a pipe of a relatively large diameter is used so that the treating liquid (liquid chemical and pure water) can be drained from the interior of the treating vessel 10 to the exterior through the drain pipe 78A in a short time after the treatment of the wafers W in the treating vessel 10 is over.

To the drain pipe 78B disposed separated from the drain pipe 78A, the main supply pipe 70 is connected through the supply pipe, or a return pipe 84 with a change-over valve VA interposed therein.

As shown in FIG. 5, a fall preventing mechanism 90 for preventing mutual contact of the wafers W at the time of liquid drain from the quick drain port 17A is provided in an upper part of the enclosure wall 12a of the vessel body 12. In the fall preventing mechanism 90 there is formed a comb-like fall preventing member 92 having plural support pieces 91 which can be inserted between adjacent wafers W, the fall preventing member 92 being formed so that it can be moved forward and backward by rotating means (not shown).

It is also possible to attach an ultrasonic oscillator 100 to the outer periphery of the enclosure wall 12a of the vessel body 12. According to this configuration, treatment can be done within the treating vessel 10 while applying ultrasonic oscillation to the treating liquid in the treating vessel by operation of the ultrasonic oscillator 100.

The following description is now provided about the operation of the liquid treating apparatus of this embodiment.

First, in FIGS. 1 and 2, the wafers W in a carrier C set to the loading/unloading section 1 are taken out one by one by the conveyance arm 4 and are delivered to one wafer holder 2a. Next, the plural wafers W held by the wafer holder 2a are delivered to the holding device 30 mounted to the lid 11. Then, in FIG. 3, by the attitude changing/moving mechanism 60, the attitude of the lid 11 (holding device 30) is changed from its horizontal attitude to a substantially vertical attitude and at the lid 11 is moved toward the vessel body 12, allowing the wafers W to be loaded into the vessel body 12 and the lid 11 to be united with the vessel body 12. As a result, the treating vessel 10 is sealed in a state in which the wafers W are accommodated in a substantially vertical attitude.

Next, in FIG. 4, the opening/closing valve V2 is opened, whereby pure water whose temperature has been adjusted to the treatment temperature is allowed to flow from the pure water supply source 71 to the main supply pipe 70. Further, a selected one of the change-over opening/closing valves Va, Vb, Vc and Vd is opened, allowing liquid chemical to be mixed with pure water, then the resulting mixture is supplied to the supply member 42. At the time of supply of liquid chemical from the supply member 42, the opening/closing valve V6 interposed in the exhaust pipe 80 which is connected to the air vent 18 is opened, the flow of the liquid chemical supplied into the treating vessel 10 becomes smooth.

During supply of the liquid chemical mixture, the nozzle 43 of the supply member 42 shown in FIG. 5 is positioned on the lower portion side of the treating vessel 10. The supply member 42 is rotated or oscillated by the rotating device 50 to supply the liquid chemical mixture to the wafers W in the treating vessel 10 while preventing spray of the liquid chemical mixture from being scattered to the wafers. Simultaneously with the supply of the liquid chemical, the wafers W held by the holding device 30 are rotated slowly around the rotational axis passing approximately through the center of the wafers by means of the rotational drive device 20 shown in FIG. 6. As a result, the liquid chemical flows toward the center from the peripheral portion of the wafers W and comes into uniform contact with the whole surface of each wafer W, whereby a liquid treatment, e.g., etching, is performed for the wafers. By controlling the rotating device 50 (FIG. 7) so that the liquid chemical supplied from the supply member 42 is directed in a larger amount toward the peripheral portion of each wafer W, the wafer peripheral portion can be treated more than the other portion of the wafer.

The liquid chemical having been supplied into the treating vessel 10 and used for the treatment is drained from the drain port 17 through the drain pipe 78. During treatment with the liquid chemical, the position of the change-over valve V0 is switched to let the liquid chemical be supplied into the gap 22 formed between the driven shaft 21 of the holding device 30 and the enclosure member 23 of the treating vessel 10, so that it is possible to prevent stagnation of the liquid chemical within the gap 22.

After the liquid chemical treatment is performed for a predetermined time, the change-over supply valve Va, Vb, Vc, or Vd, is closed to stop the supply of the liquid chemical. Then, only pure water is supplied from the supply member 42 to the wafers W in the treating vessel 10 to perform rinsing. At this time, the opening/closing valve V2 is closed and the opening/closing valve V3 is opened to supply pure water whose temperature is not adjusted. Further during this rinsing treatment the wafers W are rotated by the rotational drive device 20, so that the pure water supplied from the rotating supply member 42 flows from around the wafers W toward the center and comes into uniform contact with the hole surface of each wafer W to effect rinsing. At this time pure water is supplied from the liquid supply port 28 into the gap 22, whereby stagnation of pure water in the gap 22 is prevented. Besides, pure water can be supplied also into the gap 15 of the receptacle portion 14 by rotation of the supply member 42, so that the liquid chemical does not remain in the receptacle portion 14 (see FIG. 5).

After the rinsing treatment is performed in this way for a predetermined time, the opening/closing valve V3 is closed and the operation of the rotating device 50 is stopped to stop the supply of pure water. Thereafter, the opening/closing valves V8, V4 are opened to discharge the pure water present in the treating vessel 10 to the exterior from the quick drain port 17A through the drain pipe 78A. Simultaneously with this drainage of the pure water, drying gas, e.g., nitrogen gas ($N_2$) or a gaseous mixture of $N_2$ and IPA vapor, is supplied from the gas supply port 19 to the wafers W in the treating vessel 10 to dry the wafers W. At this time, the position of the change-over valve V0 is switched to supply the drying gas into the gap 22 from the liquid supply port 28, whereby the droplets remaining within the gap 22 are removed and drying is promoted.

As described above, after the drying treatment is performed for a predetermined time, the supply of the drying gas is stopped to finish the liquid treatment.

Next, with the attitude changing/moving mechanism 60, the lid 11 is pulled apart from the vessel body 12 and the wafers W held by the holding device 30 are taken out from the interior of the vessel body 12 and their attitude is changed from vertical to horizontal attitude. The wafers W whose attitude has thus been changed to horizontal attitude are received by the wafer holder 2b different from the wafer holder used at the time of loading, then are accommodated into an empty carrier C and, if necessary, are conveyed to the next treating apparatus.

<Second Embodiment>

Next, a liquid treating apparatus according to a second embodiment of the present invention will be described with reference to FIGS. 9 and 10. In the second embodiment, the same constituent elements as in the first embodiment will be identified by the same reference numerals as in the first embodiment and detailed explanations thereof will be omitted.

In the second embodiment, elements for operating a moving mechanism 200 in a holding device 30A are incorporated in a driven shaft 21b, thereby permitting the reduction in size of the liquid treating apparatus.

Figure 9:
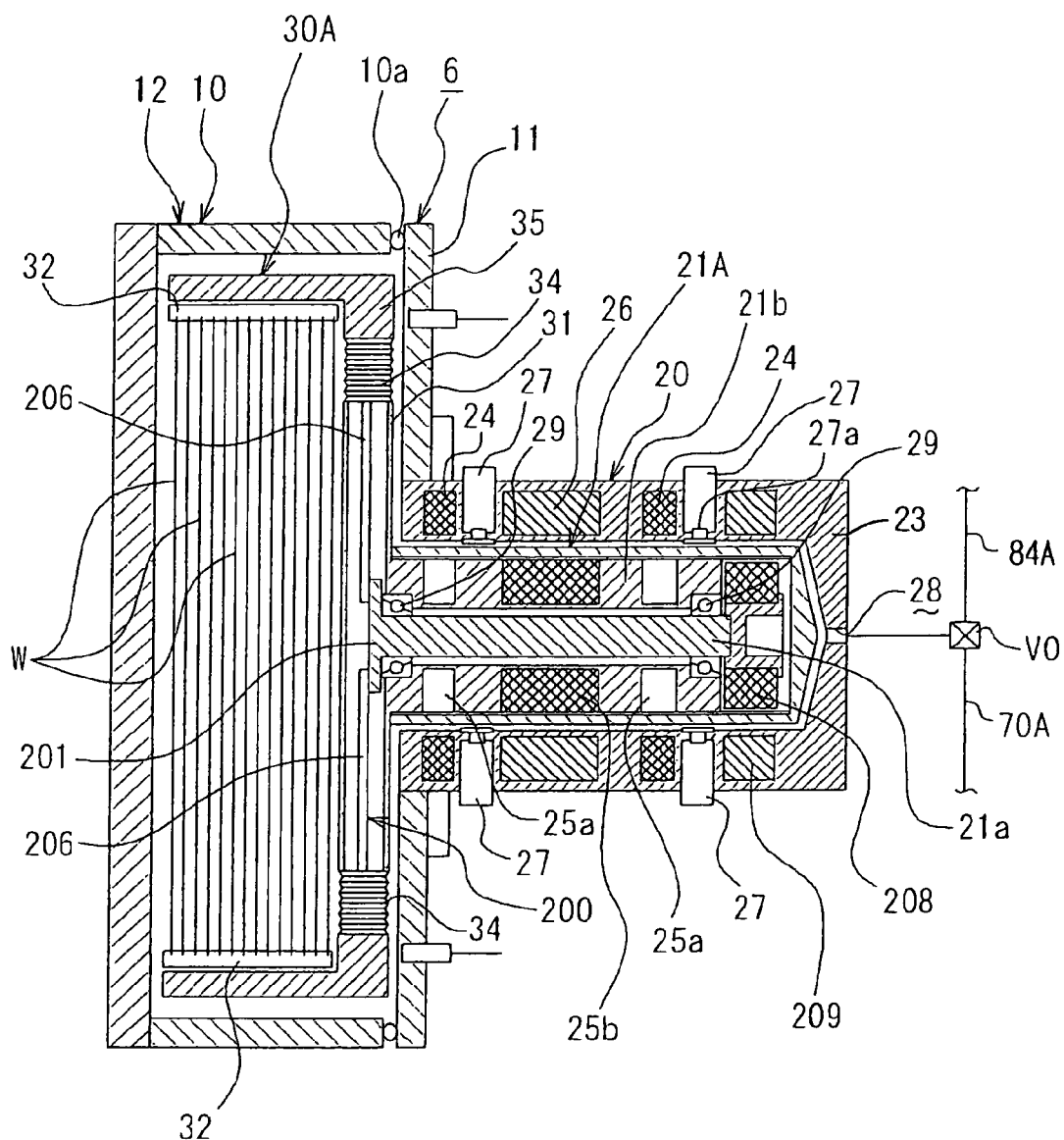
FIG. 9 is a vertical sectional view showing a liquid treating apparatus according to a second embodiment of the present invention.

As shown in FIG. 9, the holding device 30A used in this second embodiment includes a double shaft 21A, the double shaft 21A having a hollow driven shaft 21b and an operating shaft 21a disposed concentrically within the driven shaft 21b. The operating shaft 21a and the driven shaft 21b are assembled mutually rotatably through bearings 29. Like the driven shaft 21 in the first embodiment illustrated in FIGS. 6 and 8, the driven shaft 21b is connected to a base member 31 of the holding device 30A and is rotated by a rotational drive device 20. The holding device 30A includes an actuator for rotating the operating shaft 21a relatively with respect to the driven shaft 21b and is configured such that the moving mechanism 200 is operated by the relative rotation of the operating shaft 21a.

Figure 10:
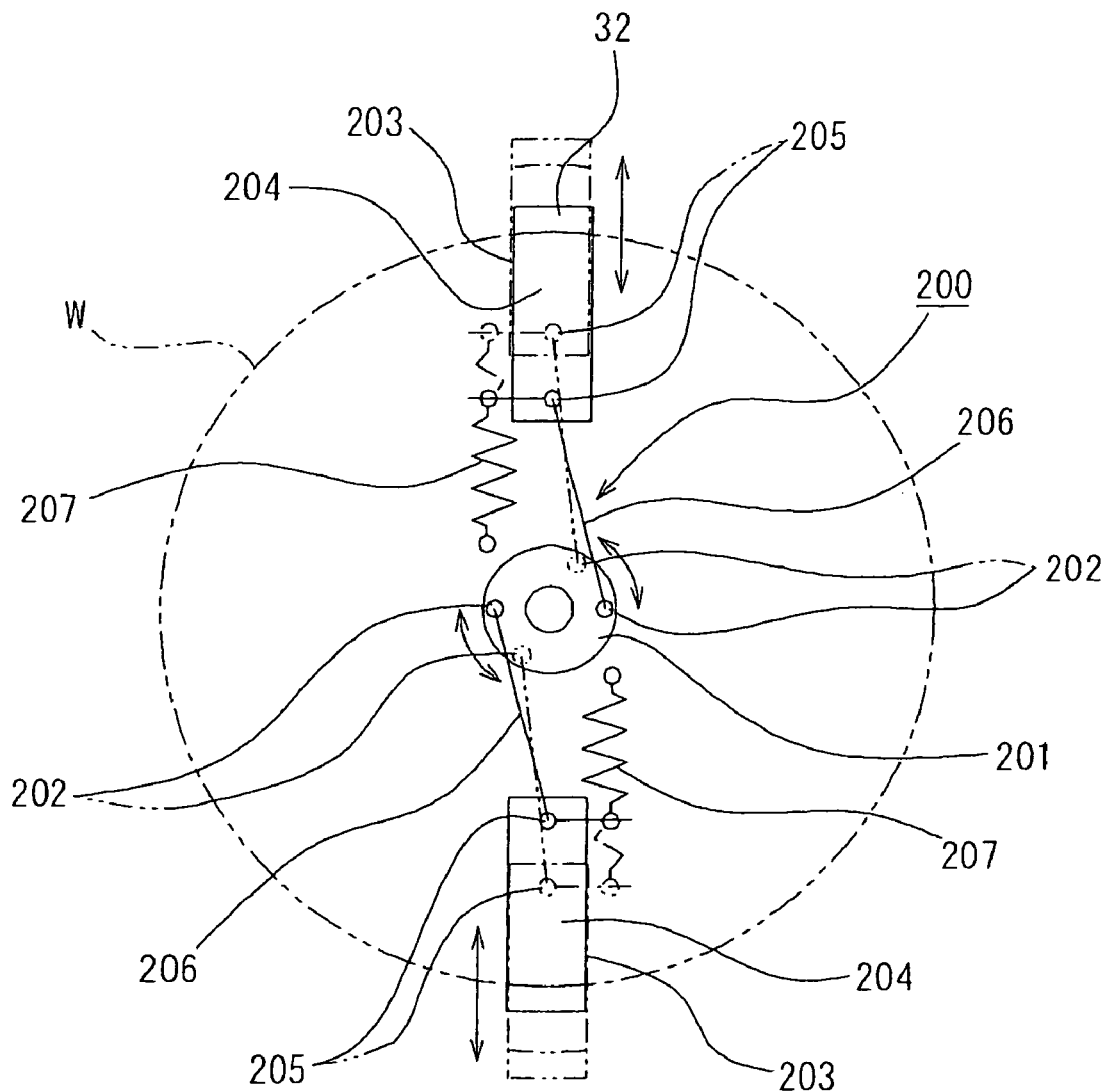
FIG. 10 is an elevation showing schematically a moving mechanism for the holding device in the liquid treating apparatus shown in FIG. 9.

More specifically, as shown in FIGS. 9 and 10, the moving mechanism 200 includes a rotary disc 201 fixed to one end of the operating shaft 21a and sliders 204 (FIG. 10) joined to movable members 35 respectively. Each slider 204 is mounted radially slidably with respect to the base member 31 (FIG. 9). A link 206 is provided to provide connection between a base end 205 of each slider 204 and an outer periphery portion 202 of the rotary disc 201. Each slider 204 is urged radially inwards with respect to the rotational axis by means of a tension spring 207 (FIG. 10).

As shown in FIG. 9, as actuator means for rotating the operating shaft 21a relatively with respect to the driven shaft 21b there are provided an operating magnet 208 mounted on a front end portion of the operating shaft 21a and an operating electromagnet 209 embedded in an enclosure member 23 in a position confronting the magnet 208. The operating shaft 21a and the rotary disc 201 can be rotated clockwise or counter-clockwise (FIG. 10) by changing the direction of an electric current flowing in the electromagnet 209. With this rotation, each slider 204 can be moved radially inwards or outwards with respect to the rotational axis. As a result, each movable member 35 and holding member 32 can be moved radially inwards or outwards (between the wafer holding position and the wafer release position) with respect to the rotational axis.

The rotary disc 201, guides 203, sliders 204, tension springs 207 and links 206 (FIG. 10) which constitute the moving mechanism 200 are accommodated inside the base member 31, movable members 35 and expansion members 34 in a fluid-tight manner.

On the other hand, a floating electromagnet 24 and a positioning electromagnet 26, which are substantially the same as in the first embodiment, are embedded in the enclosure member 23. Moreover, a floating permanent magnet 25a is embedded in the driven shaft 21b at a position opposed to the electromagnet 24 and a positioning permanent magnet 25b is embedded in the driven shaft 21b at a position opposed to the electromagnet 26. In this way the rotational drive device 20 similar to that in the first embodiment is constructed.

Thus, as in the first embodiment, the driven shaft 21b (double shaft 21A) can be rotated in a non-contact manner with a gap formed between it and the enclosure member 23 and therefore it is possible to suppress the generation of particles caused by rotation of the holding device 30.

<Modification>

Although in the above embodiments, it is described that plural wafers W are treated at a time, it goes without saying that the present invention is also applicable to a liquid treating apparatus which treats one wafer W at a time.

Although it is described that the holding devices 30 and 30A are each attached to the lid 11, no limitation is made thereto. For example, if there is adopted a structure wherein the delivery of wafers W to the liquid treating apparatus is done directly within the treating vessel 10, the holding devices 30 and 30A can each be mounted to the vessel body 12.

Moreover, the generally flat plate-like workpiece is not limited to the wafer, but may be, for example, a glass substrate for LCD or a disc substrate.

Further, although the construction is described which permits the supply of a maximum of four kinds of liquid chemicals, pure water and their mixtures as treating liquid to the wafers W and the gap 22 through the supply member 42 and the liquid supply port 28, no limitation is made thereto. The present invention is applicable also to the case where only one kind of treating liquid is supplied. The present invention is applicable more preferably to a construction which permits the supply of at least two kinds of treating liquids (first and second treating liquids).

The invention claimed is:

1. A liquid treating apparatus comprising:
holding means for holding a generally flat plate-like workpiece in a substantially vertical attitude;
a treating vessel for accommodating the workpiece held by said holding means;
a treating liquid supply system for supplying a treating liquid to the workpiece accommodated in said treating vessel; and
rotational drive means for rotating said holding means around a rotational axis passing approximately through the center of the workpiece in a state of non-contact with the treating vessel and the rotational drive means,
wherein said holding means includes:
at least a pair of holding members for holding an outer edge of the workpiece from outside in a radial direction with respect to said rotational axis;
a moving mechanism for moving said holding members radially with respect to said rotational axis;
a driven shaft adapted to be rotationally driven by said rotational drive means;
an operating shaft disposed concentrically within said driven shaft; and
actuator means for rotating said operating shaft relatively with respect to said driven shaft, and
wherein said moving mechanism is operated by the rotation of said operating shaft.

2. The liquid treating apparatus according to claim 1, wherein:
said holding means includes a driven shaft adapted to be rotationally driven by said rotational drive means; and
said treating vessel includes an enclosure member which encloses said driven shaft of said holding means so as to form a gap between the enclosure member and the driven shaft, said enclosure member having a liquid supply port for supplying the treating liquid into said gap.

3. The liquid treating apparatus according to claim 2, wherein said liquid supply port is positioned on the end side of the enclosure member on said rotational axis.

4. The liquid treating apparatus according to claim 3, wherein said driven shaft has a convex end opposed to said liquid supply port.

5. The liquid treating apparatus according to claim 2, further comprising a gas supply system for supplying a drying gas into said gap through said liquid supply port.

6. The liquid treating apparatus according to claim 5, wherein said treating vessel includes a gas supply port through which the drying gas is supplied to the workpiece by said gas supply system.

7. A liquid treating apparatus according to claim 2, wherein:
the treating liquid supply system is configured to allow at least first and second treating liquids to be supplied; and
when said first treating liquid is supplied by said treating liquid supply system, the first treating liquid is supplied from said liquid supply port into said gap, while when said second treating liquid is supplied by said treating liquid supply system, the second treating liquid is supplied from said liquid supply port into said gap.

8. The liquid treating apparatus according to claim 1, wherein said treating vessel includes:
a vessel body having an enclosure wall and a closing wall, said enclosure wall enclosing the workpiece from outside in a radial direction with respect to said rotational axis and having openings on both end sides thereof in said rotational axis direction, and said closing wall closing one-end side of said enclosure wall; and
a lid for opening and closing the other end-side opening of said enclosure wall in a fluid-tight manner.

9. The liquid treating apparatus according to claim 8, wherein said holding means is attached to said lid.

10. The liquid treating apparatus according to claim 8, wherein said holding means is attached to said vessel body.

11. A liquid treating apparatus comprising:
holding means for holding a generally flat plate-like workpiece in a substantially vertical attitude;
a treating vessel for accommodating the workpiece held by said holding means;
a treating liquid supply system for supplying a treating liquid to the workpiece accommodated in said treating vessel; and
rotational drive means for rotating said holding means around a rotational axis passing approximately through the center of the workpiece in a state of non-contact with the treating vessel and the rotational drive means, wherein:
said holding means includes a driven shaft adapted to be rotationally driven by said rotational drive means;
said treating vessel includes an enclosure member which encloses the driven shaft of said holding means;

said rotational drive means is configured to hold said driven shaft in a state of non-contact with said enclosure member under the action of an electromagnetic force; and said liquid treating apparatus further comprises movement inhibiting means for inhibiting downward movement of the driven shaft of said holding means with respect to said enclosure member in a state in which said electromagnetic force does not act.

12. A liquid treating apparatus comprising:

holding means for holding a generally flat plate-like workpiece;

a treating vessel for accommodating the workpiece held by said holding means;

a treating liquid supply system for supplying a treating liquid to the workpiece accommodated in said treating vessel; and rotational drive means for rotating said holding means around a rotational axis passing approximately through the center of the workpiece in a state of non-contact with the treating vessel and the rotational drive means, wherein said holding means includes:

at least a pair of holding members for holding an outer edge of the workpiece from outside in a radial direction with respect to said rotational axis;

a moving mechanism for moving said holding members radially with respect to said rotational axis;

wherein said holding means includes:

a driven shaft adapted to be rotationally driven by said rotational drive means;

an operating shaft disposed concentrically within said driven shaft; and actuator means for rotating said operating shaft relatively with respect to said driven shaft, and wherein said moving mechanism is operated by the rotation of said operating shaft.

13. The liquid treating apparatus according to claim 12, wherein:

said holding means includes a driven shaft adapted to be rotationally driven by said rotational drive means; and said treating vessel includes an enclosure member which encloses said driven shaft of said holding means so as to form a gap between the enclosure member and the driven shaft, said enclosure member having a liquid supply port for supplying the treating liquid into said gap.

14. The liquid treating apparatus according to claim 12, wherein said treating vessel includes:

a vessel body having an enclosure wall and a closing wall, said enclosure wall enclosing the workpiece from outside in a radial direction with respect to said rotational axis and having openings on both end sides thereof in said rotational axis direction, and said closing wall closing one-end side of said enclosure wall; and a lid for opening and closing the other end-side opening of said enclosure wall in a fluid-tight manner.

\* \* \* \* \*